US009059688B2

(12) United States Patent
Zhu et al.

(10) Patent No.: US 9,059,688 B2
(45) Date of Patent: *Jun. 16, 2015

(54) HIGH-PRECISION OSCILLATOR SYSTEMS WITH FEED FORWARD COMPENSATION FOR CCFL DRIVER SYSTEMS AND METHODS THEREOF

(71) Applicant: ON-BRIGHT ELECTRONICS (SHANGHAI) CO., LTD., Shanghai (CN)

(72) Inventors: Liqiang Zhu, Shanghai (CN); Miao Li, Shanghai (CN); Lieyi Fang, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/763,535

(22) Filed: Feb. 8, 2013

(65) Prior Publication Data

US 2013/0147527 A1    Jun. 13, 2013

Related U.S. Application Data

(62) Division of application No. 12/823,378, filed on Jun. 25, 2010, now Pat. No. 8,395,425.

(30) Foreign Application Priority Data

May 17, 2010 (CN) .......................... 2010 1 0182754

(51) Int. Cl.
*H03K 4/06* (2006.01)
*H02M 7/538* (2007.01)
(Continued)

(52) U.S. Cl.
CPC ............ *H03K 4/06* (2013.01); *H02M 7/53803* (2013.01); *H02M 2001/0022* (2013.01); *H05B 41/282* (2013.01); *H05B 41/2824* (2013.01); *H05B 41/2828* (2013.01); *Y02B 20/183* (2013.01)

(58) Field of Classification Search
CPC ............ H03K 4/06; H03K 4/12; H03K 4/50; H03K 4/20; H03K 3/0231
USPC .................................................. 327/131, 132
See application file for complete search history.

(56) References Cited

U.S. PATENT DOCUMENTS 6,181,092 B1   1/2001 Turner
6,674,656 B1   1/2004 Yang et al.
(Continued)

FOREIGN PATENT DOCUMENTS

CN       1908740 A      2/2007
CN    101582631 A     11/2009
(Continued)

OTHER PUBLICATIONS

Chinese Patent Office, Office Action dated Feb. 5, 2013, issued in counterpart Chinese Patent Application No. 201010182754.5, to which this instant U.S. application claims priority.

*Primary Examiner* — Diana J Cheng
(74) *Attorney, Agent, or Firm* — Jones Day

(57) ABSTRACT

System and method for generating one or more ramp signals. The method includes an oscillator configured to generate at least a clock signal, and a ramp signal generator configured to receive at least the clock signal and generate a first ramp signal. Additionally, the ramp signal generator is coupled to a first resistor including a first terminal and a second terminal. The first resistor is configured to receive an input voltage at the first terminal and is coupled to the ramp signal generator at the second terminal. Moreover, the first resistor is associated with a first resistance value. Also, the clock signal is associated with at least a predetermined frequency. The predetermined frequency does not change if the input voltage changes from a first magnitude to a second magnitude. The first magnitude is different from the second magnitude.

8 Claims, 10 Drawing Sheets

(51) Int. Cl.
*H05B 41/282* (2006.01)
*H02M 1/00* (2006.01)

(56) References Cited

U.S. PATENT DOCUMENTS

| | | | |
|---|---|---|---|
| 6,728,121 B2 | 4/2004 | Ben-Yaakov et al. |
| 6,930,520 B2 | 8/2005 | Solie |
| 7,180,274 B2 | 2/2007 | Chen et al. |
| 7,298,261 B2 | 11/2007 | Fujimori et al. |
| 7,515,441 B2 | 4/2009 | Kashima |
| 7,576,574 B2 | 8/2009 | Noda |
| 7,990,121 B2 | 8/2011 | Kojima et al. |
| 8,058,939 B2 | 11/2011 | Bea et al. |
| 8,395,425 B2 | 3/2013 | Zhu et al. |
| 2007/0108947 A1 | 5/2007 | Liao |
| 2007/0132692 A1 | 6/2007 | Yang |
| 2009/0261797 A1 | 10/2009 | Shibata |
| 2011/0043175 A1 | 2/2011 | Sohma |

FOREIGN PATENT DOCUMENTS

| | | |
|---|---|---|
| TW | 200947865 | 11/2009 |
| TW | I 436593 | 5/2014 |

HIGH-PRECISION OSCILLATOR SYSTEMS WITH FEED FORWARD COMPENSATION FOR CCFL DRIVER SYSTEMS AND METHODS THEREOF

1. CROSS-REFERENCES TO RELATED APPLICATIONS

This application is a continuation of U.S. patent application Ser. No. 12/823,378, filed Jun.25, 2010, which claims priority to Chinese Patent Application No. 201010182754.5, filed May 17, 2010, both applications being commonly assigned and incorporated by reference herein for all purposes.

2. BACKGROUND OF THE INVENTION

The present invention is directed to oscillator systems. More particularly, the invention provides a high-precision oscillator system with feed forward compensation. Merely by way of example, the invention has been applied to cold-cathode fluorescent lamp (CCFL) backlight driver systems. But it would be recognized that the invention has a much broader range of applicability. For example, the present invention can be applied to integrated circuit systems other than CCFL backlight driver systems. In another example, the present invention can be applied to devices other than integrated circuits.

An oscillator system is often used as an important component for pulse-width-modulation (PWM) control in a cold-cathode fluorescent lamp (CCFL) backlight driver system. For example, the oscillator system can generate a high-frequency clock signal for internal timing control and a high-frequency ramp signal that is compared to an error signal.

FIGS. 1(A) and (B) are simplified diagrams showing a conventional PWM control system. The PWM control system 100 includes an error amplifier 110, an oscillator 120, a PWM comparator 130, a capacitor 140, and a driver 150. The oscillator 120 is configured to generate a ramp signal 122 and a clock signal 124. Additionally, the oscillator 120 is coupled to a resistor 192, which can be used to adjust the frequency of the ramp signal 122 and the clock signal 124.

The error amplifier 110 receives a reference voltage $V_{ref}$ at the "+" terminal and a feedback voltage $V_{FB}$ at the "−" terminal. The feedback voltage indicates the magnitude of the current that follows through a CCFL 160. The difference between the reference voltage and the feedback voltage is amplified by the error amplifier 110, whose output terminal 116 is connected to the capacitor 140. The capacitor 140 is used as the compensation network for system loop stability.

As shown in FIGS. 1(A) and (B), the capacitor 140, together with the error amplifier 110, outputs a CMP signal 142 to the PWM comparator 130. The PWM comparator 130 also receives the ramp signal 122 from the oscillator 120. The ramp signal 122 is compared to the CMP signal 142 by the PWM comparator 130, which sends a PWM control signal 132 to the driver 150. The duty cycle of the PWM control signal 132 depends at least in part on the comparison between the CMP signal 142 and the ramp signal 122.

The driver 150 receives the PWM control signal 132 and outputs a PWM drive signal 152 to a power stage 165. From the power stage 165, the power is transferred to an output stage through a transformer 190. The current that flows through the CCFL 160 is converted into the feedback voltage by a resistor 195.

FIG. 2 is a simplified diagram showing conventional waveforms for the PWM control system 100 as shown in FIGS. 1(A) and (B). The PWM comparator 130 receives the CMP signal 142 at the "+" terminal and the ramp signal 122 at the "−" terminal. If the voltage of the CMP signal 142 is higher than the voltage of the ramp signal 122, the voltage of the PWM signal 132 is at the logic high level. If the voltage of the CMP signal 142 is lower than the voltage of the ramp signal 122, the voltage of the PWM signal 132 is at the logic low level. Hence, the duty cycle of the PWM signal 132 is determined by the waveforms of the CMP signal 142 and the ramp signal 122. Additionally, the frequency of the PWM signal 132 is the same as the ramp signal 122 and the clock signal 124, both of which are generated by the oscillator 120. The frequency of the ramp signal 112 is independent of the input voltage $V_{IN}$, and the upward slope of the ramp signal 112 is independent of the input voltage $V_{IN}$.

FIG. 3 is a simplified diagram showing the conventional oscillator 120, and FIG. 4 is a simplified diagram showing conventional waveforms for the oscillator 120.

As shown in FIG. 3, the oscillator 120 includes voltage comparators 305 and 310, a capacitor 320, and switches 325 and 330. The voltage comparators 305 and 310 use internal reference voltages $V_H$ and $V_L$ as threshold voltages respectively. The reference voltage $V_H$ is set higher than the reference voltage $V_L$.

For the capacitor 320, the current $I_C$ serves as the charging current, and the current $I_D$ serves as the discharging current. Specifically, after the oscillator 120 is activated, the switch 325 is closed and the switch 330 is open. The current $I_C$ then charges the capacitor 320, which outputs a voltage 322. The voltage 322 is the ramp signal 122. If the voltage 322 becomes higher than the reference voltage $V_H$, the switch 325 is open and the switch 330 is closed. Consequently, the current $I_C$ stops charging the capacitor 320, and the current $I_D$ starts discharging the capacitor 320.

When the voltage 322 becomes lower than the reference voltage $V_L$, the switch 325 is again closed and the switch 330 becomes again open. Then, the current $I_D$ stops discharging the capacitor 320, and the current $I_C$ starts charging the capacitor 320 until the voltage 322 becomes higher than the reference voltage $V_H$ again. As shown in FIG. 3, the capacitor 320 is internal to the chip where the oscillator 120 is located. The chip can also include a trimming circuit to improve the precision and consistency of the oscillation frequency. In another example, the currents $I_C$ and $I_D$ are determined by the resistor 192.

As shown in FIG. 4, this charging and discharging process for the capacitor 320 often continues. Additionally, each charging period is represented by $T_{ON}$, and each discharging period is represented by $T_{OFF}$.

$$T_{ON} = \frac{(V_H - V_L) \times C_O}{I_C} \quad (1A)$$

$$T_{OFF} = \frac{(V_H - V_L) \times C_O}{I_D} \quad (1B)$$

Where $C_O$ represents the capacitance value of the capacitor 320. Hence, $$f_S = \frac{1}{T_{ON} + T_{OFF}} = \frac{1}{(V_H - V_L) \times C_O} \times \frac{I_C \times I_D}{I_C + I_D} \quad (2)$$

Where $f_s$ represents the frequency of the ramp signal 122 and the clock signal 124. Also, for example, the duty cycle D of the ramp signal 122 is $$D = \frac{T_{ON}}{T_{ON} + T_{OFF}} \quad (3)$$

The conventional PWM control system as described above often has one or more disadvantages. For example, if the input voltage $V_{IN}$ changes, the current flowing through the CCFL may change instantly, but the feedback loop has a relatively slow response. Hence the dynamic adjustment of the PWM control system is usually not sufficiently fast.

The conventional PWM control system can be improved by using a forward feed compensation technique. The forward feed compensation technique can, to certain extent, improve the dynamic response and reliability of the conventional PWM control system. Since the ramp signal is usually generated by an oscillator, the feed forward technique has been implemented in the conventional oscillator design.

FIG. 5 is a simplified diagram showing a conventional oscillator system with feed forward compensation, and FIG. 6 is a simplified diagram showing conventional timing relationship for the PWM control system using the oscillator system as shown in FIG. 5.

As shown in FIG. 5, a resistor 502 and a capacitor 504 are external to a control chip 510, and used to adjust the output frequency of the oscillator system. Additionally, resistors 522 and 524 are internal to the control chip 510 and used to determine a compensation ratio. The ramp signal 550 of the oscillator system is output at a node 506.

At the beginning, the voltage level of the ramp signal 550 increases as a result of charging the capacitor 504 by the input voltage $V_{IN}$ through the resistor 502. If the voltage level at the node 506 becomes higher than the reference voltage $V_H$, a comparator 532 outputs a voltage 534 at the logic low level. Since the reference voltage $V_L$ is lower than the reference voltage $V_H$, a comparator 536 in contrast outputs a voltage 538 at the logic high level. The output voltages 534 and 536 are processed by logic gates 540, 542, and 544. The logic gates 540 and 542 form a RS flip-flop, and the logic gate 544 is a NOT gate.

If the voltage 534 is at the logic low level and the voltage 538 is at the logic high level, the NOT gate 544 would output a voltage 546 at the logic high level. Consequently, a transistor 560 is turned on and the capacitor 504 is discharged. When the voltage level of the ramp signal at the node 506 becomes lower than the reference voltage $V_L$, the voltage 546 is changed to the logic low level, which causes the transistor 560 to be turned off Consequently, the input voltage $V_{IN}$ starts re-charging the capacitor 504.

As shown in FIGS. 5 and 6, the reference voltage $V_H$ changes with the input voltage $V_{IN}$. Specifically, $$V_H = \frac{R_1}{R_1 + R_2} V_{IN} \quad (4)$$

Where $R_1$ and $R_2$ represent resistance values of the resistors 522 and 524 respectively. Additionally, the reference voltage $V_L$ is often set to a very low level, such as 0.1 volt. As shown in FIG. 6, the ramp signal 550 increases from the reference voltage $V_L$ to the reference voltage $V_H$, and then decreases from the reference voltage $V_H$ to the reference voltage $V_L$.

As shown in FIG. 6, if the input voltage $V_{IN}$ increases, the reference voltage $V_H$ also increases. Consequently, the frequency of the ramp signal 550 is determined as follows:

$$f_r = \frac{1}{R_T \times C_T \times \ln\frac{V_{IN}}{V_{IN} - V_H}} \quad (5)$$

where $f_r$ represents the frequency of the ramp signal 550, $R_T$ represents the resistance value of the resistor 502, and $C_T$ represents the resistance value of the capacitor 504. Additionally, as discussed above, FIG. 6 is a simplified diagram. In more detail, the upward slope of the ramp signal 550 increases with the input voltage $V_{IN}$.

The conventional feed forward compensation technique often does not provide high precision and stability for the oscillation frequency. Hence it is highly desirable to improve the techniques for oscillation systems.

3. BRIEF SUMMARY OF THE INVENTION

The present invention is directed to oscillator systems. More particularly, the invention provides a high-precision oscillator system with feed forward compensation. Merely by way of example, the invention has been applied to cold-cathode fluorescent lamp (CCFL) backlight driver systems. But it would be recognized that the invention has a much broader range of applicability. For example, the present invention can be applied to integrated circuit systems other than CCFL backlight driver systems. In another example, the present invention can be applied to devices other than integrated circuits.

According to one embodiment, a system for generating one or more ramp signals includes an oscillator configured to generate at least a clock signal, and a ramp signal generator configured to receive at least the clock signal and generate a first ramp signal. Additionally, the ramp signal generator is coupled to a first resistor including a first terminal and a second terminal. The first resistor is configured to receive an input voltage at the first terminal and is coupled to the ramp signal generator at the second terminal. Moreover, the first resistor is associated with a first resistance value. Also, the clock signal is associated with at least a predetermined frequency. The predetermined frequency does not change if the input voltage changes from a first magnitude to a second magnitude. The first magnitude is different from the second magnitude. The first ramp signal is associated with at least the predetermined frequency and a first slope. The first slope is related to an increase of the first ramp signal, and the first slope changes if the input voltage changes from the first magnitude to the second magnitude.

According to another embodiment, a system for generating a control signal for pulse width modulation includes an oscillator configured to generate at least a clock signal, and a ramp signal generator configured to receive at least the clock signal and generate a ramp signal. The ramp signal generator is coupled to a first resistor including a first terminal and a second terminal. Additionally, the system includes an error amplifier coupled to a capacitor. The error amplifier is configured to receive a predetermined voltage and a feedback voltage and to generate an amplified signal with the capacitor. Moreover, the system includes a comparator configured to receive the amplified signal and the ramp signal and generate a comparison signal based on at least information associated with the amplified signal and the ramp signal. Also, the system includes a NOT gate configured to receive the clock signal and generate a processed signal, and an AND gate configured to receive the processed signal and the comparison signal and generate an output signal for pulse width modulation. The first resistor is configured to receive an input voltage at the first terminal and is coupled to the ramp signal generator at the second terminal, and the first resistor is associated with a first resistance value. The clock signal is associated with at least a predetermined frequency, and the predetermined frequency does not change if the input voltage changes from a first magnitude to a second magnitude. The first magnitude is different from the second magnitude. The output signal is associated with at least the predetermined frequency and a duty cycle. The duty cycle changes if the input voltage changes from the first magnitude to the second magnitude.

According to yet another embodiment, a method for generating one or more ramp signals includes generating at least a clock signal by an oscillator, and receiving an input voltage by a resistor. The resistor is associated with a resistance value. Additionally, the method includes generating a first current flowing through the resistor, receiving at least the first current and the clock signal by a ramp signal generator, and generating a first ramp signal based on at least information associated with the first current and the clock signal. The clock signal is associated with at least a predetermined frequency, and the predetermined frequency does not change if the input voltage changes from a first magnitude to a second magnitude. The first magnitude is different from the second magnitude. The first ramp signal is associated with at least the predetermined frequency and a first slope, and the first slope is related to an increase of the first ramp signal. The first slope changes if the input voltage changes from the first magnitude to the second magnitude.

According to yet another embodiment, a method for generating a control signal for pulse width modulation includes generating at least a clock signal by an oscillator, and receiving an input voltage by a resistor. The resistor is associated with a resistance value. Additionally, the method includes generating a first current flowing through the resistor, receiving at least the first current and the clock signal by a ramp signal generator, and generating a ramp signal based on at least information associated with the first current and the clock signal. Moreover, the method includes receiving a predetermined voltage and a feedback voltage by an error amplifier, generating an amplified signal based on at least information associated with the predetermined voltage and the feedback voltage, receiving the amplified signal and the ramp signal by a comparator, and generating a comparison signal based on at least information associated with the amplified signal and the ramp signal. Also, the method includes receiving the clock signal by a NOT gate, generating a processed signal based on at least information associated with the clock signal, receiving the processed signal and the comparison signal by an AND gate, and generating an output signal for pulse width modulation based on at least information associated with the processed signal and the comparison signal. The clock signal is associated with at least a predetermined frequency. The predetermined frequency does not change if the input voltage changes from a first magnitude to a second magnitude, and the first magnitude is different from the second magnitude. The output signal is associated with at least the predetermined frequency and a duty cycle, and the duty cycle changes if the input voltage changes from the first magnitude to the second magnitude.

Many benefits are achieved by way of the present invention over conventional techniques. Certain embodiments of the present invention can provide a ramp signal whose frequency is precisely controlled. Some embodiments of the present invention can provide a ramp signal whose frequency is independent from the input voltage but can be adjusted through a resistor that is external to a chip where the oscillation system is located. Certain embodiments of the present invention can provide a ramp signal whose compensation coefficient for feed forward compensation is programmable and/or adjustable. For example, the compensation coefficient is adjusted through one or more circuit elements that are external to the chip where the oscillation system is located.

Certain embodiments of the present invention can provide a PWM control signal whose frequency is precisely controlled. Some embodiments of the present invention can provide a PWM control signal whose frequency is independent from the input voltage but can be adjusted through a resistor that is external to a chip where the PWM control system is located. Certain embodiments of the present invention can provide a PWM control signal whose compensation coefficient for feed forward compensation is programmable and/or adjustable. For example, the compensation coefficient is adjusted through one or more circuit elements that are external to the chip where the PWM control system is located.

Depending upon embodiment, one or more of these benefits may be achieved. These benefits and various additional objects, features and advantages of the present invention can be fully appreciated with reference to the detailed description and accompanying drawings that follow.

4. BRIEF DESCRIPTION OF THE DRAWINGS

FIGS. 1(A) and (B) are simplified diagrams showing a conventional PWM control system.

5. DETAILED DESCRIPTION OF THE INVENTION

The present invention is directed to oscillator systems. More particularly, the invention provides a high-precision oscillator system with feed forward compensation. Merely by way of example, the invention has been applied to cold-cathode fluorescent lamp (CCFL) backlight driver systems. But it would be recognized that the invention has a much broader range of applicability. For example, the present invention can be applied to integrated circuit systems other than CCFL backlight driver systems. In another example, the present invention can be applied to devices other than integrated circuits.

Figure 1A:
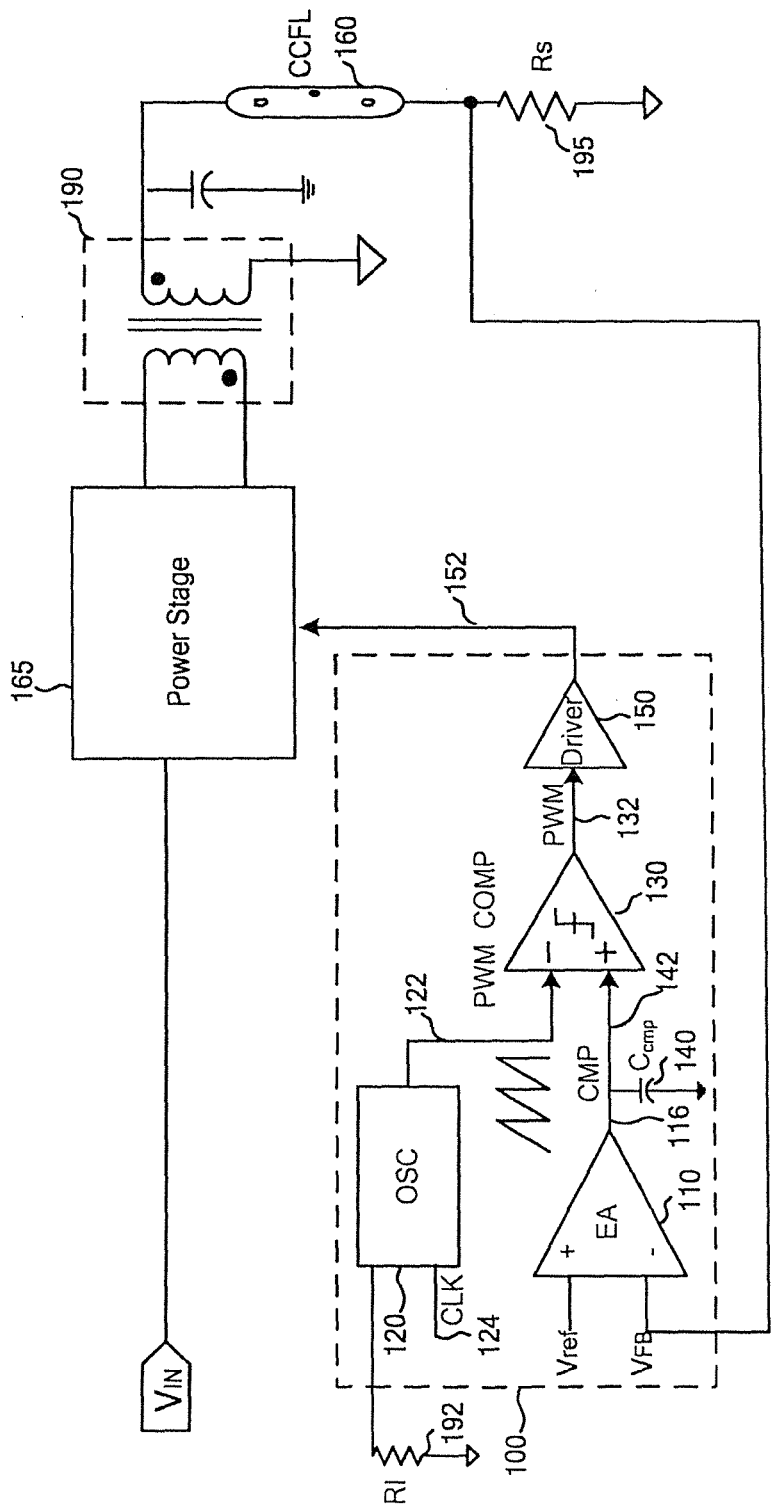
Figure 1B:
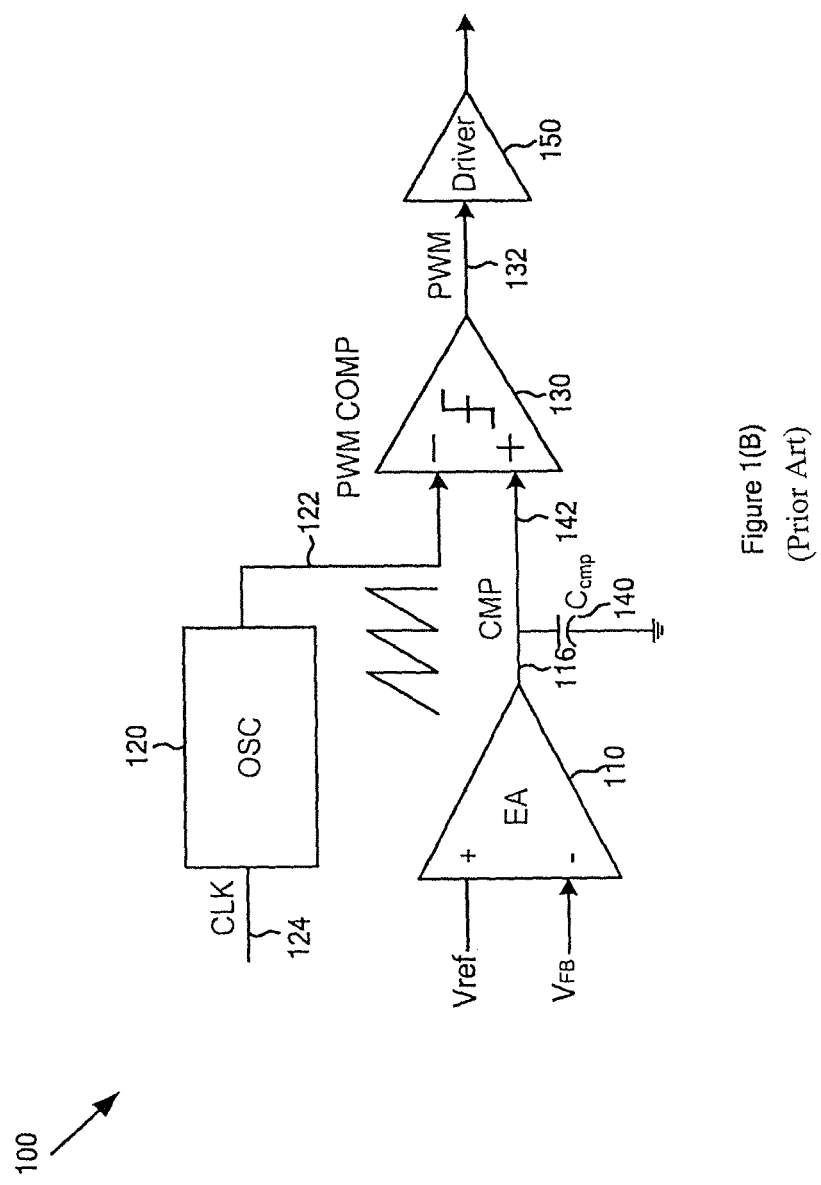
Figure 2:
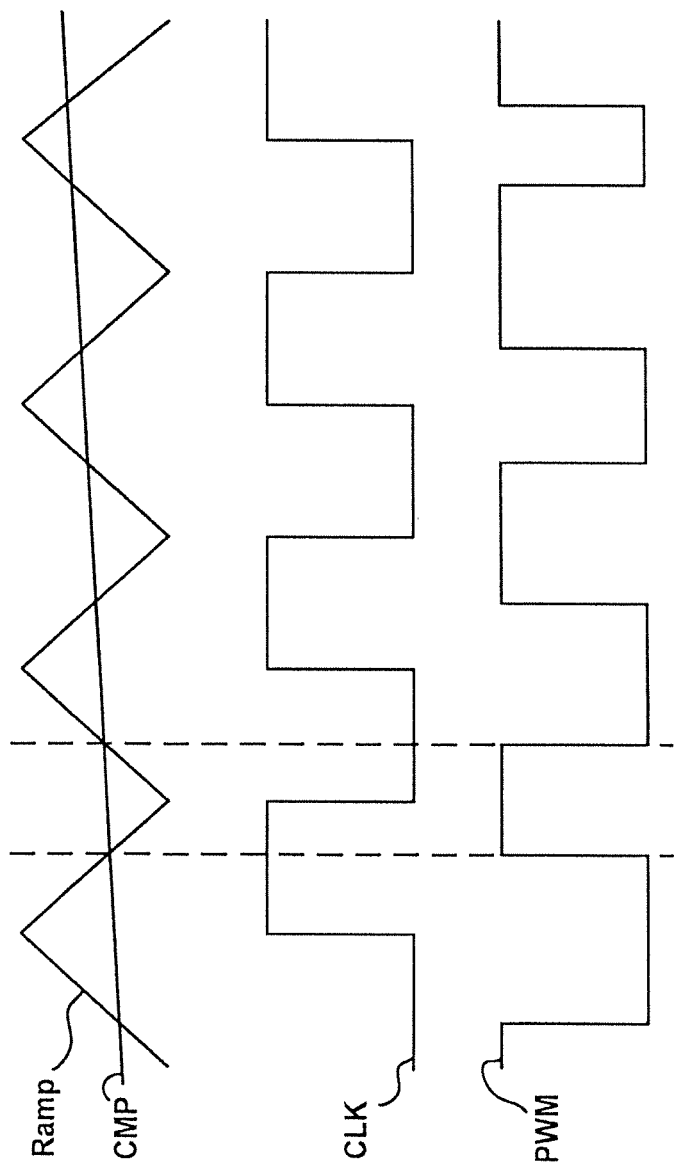
FIG. 2 is a simplified diagram showing conventional waveforms for the PWM control system as shown in FIGS. 1(A) and (B).
Figure 3:
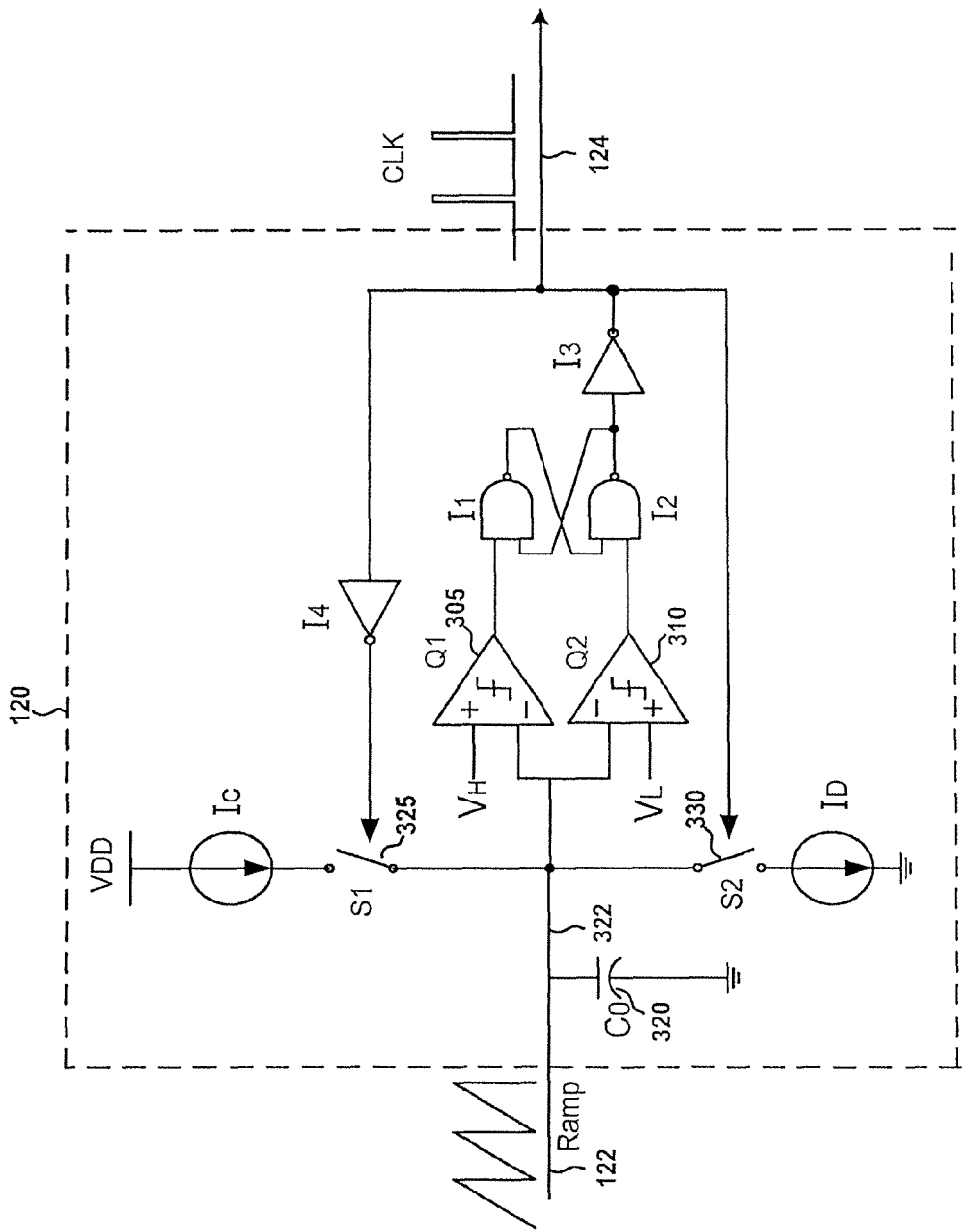
FIG. 3 is a simplified diagram showing the conventional oscillator.
Figure 4:
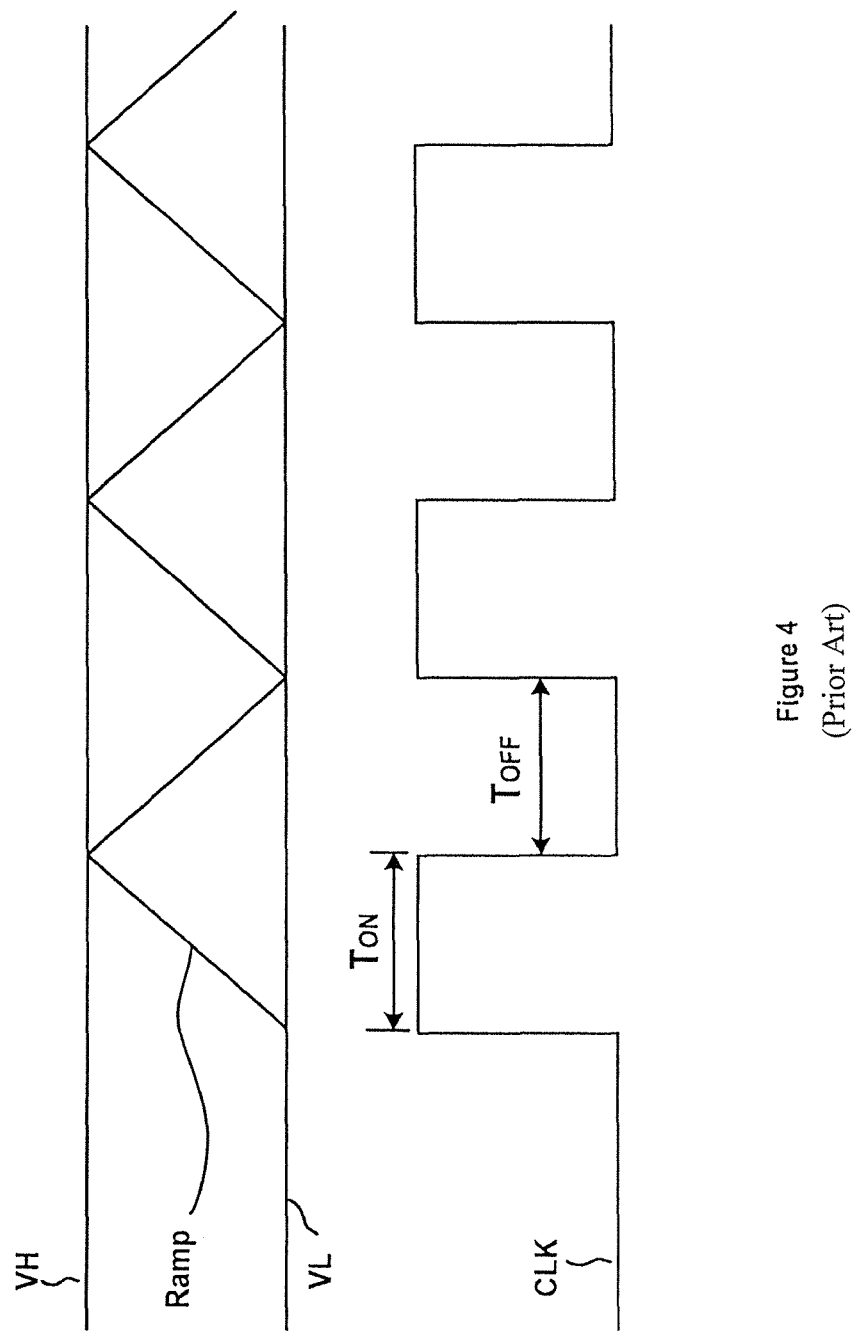
FIG. 4 is a simplified diagram showing conventional waveforms for the oscillator.
Figure 5:
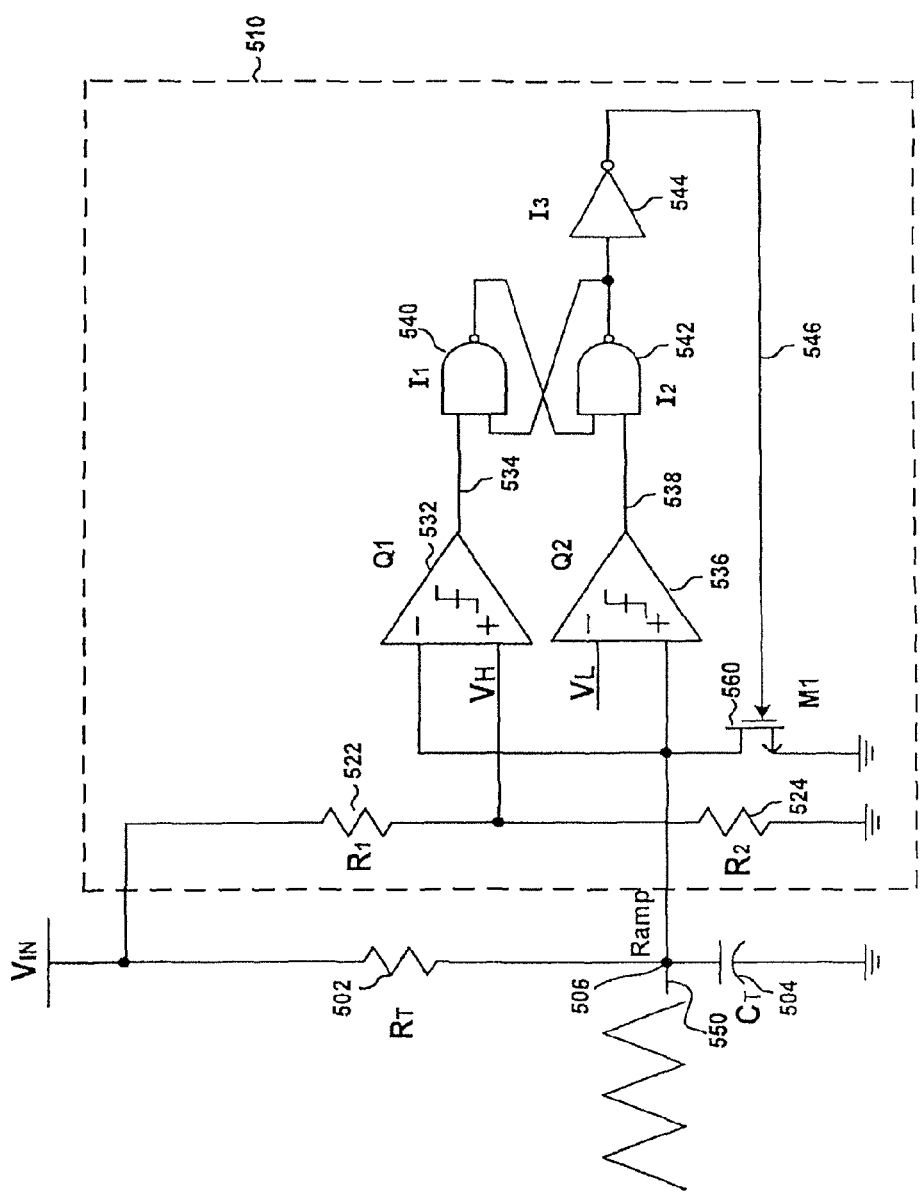
FIG. 5 is a simplified diagram showing a conventional oscillator system with feed forward compensation.
Figure 6:
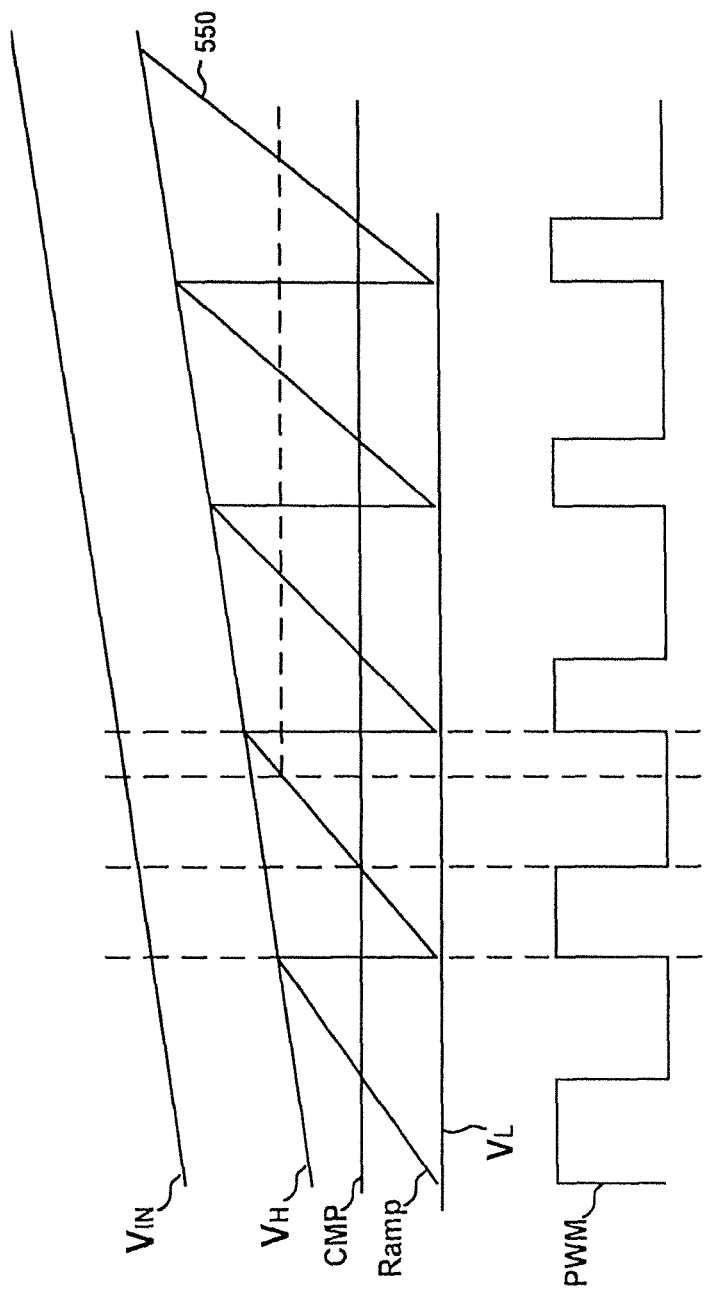
FIG. 6 is a simplified diagram showing conventional timing relationship for the PWM control system using the oscillator system.

The conventional oscillation system with feed forward compensation as shown in FIGS. 5 and 6 has several disadvantages. Based on Equations 4 and 5, the frequency of the ramp signal 550 is determined at least in part by the external resistor 502 and the external capacitor 504. Often, the capacitance value of the external capacitor 504 is not precisely controlled; hence the frequency of the ramp signal also may not be accurate. Additionally, the frequency of the ramp signal 550 changes with $V_{IN}$; hence the frequency is usually not stable. Moreover, the compensation coefficient is determined by the resistance values of the internal resistors 322 and 324, which usually are difficult to adjust based on operation conditions of the system.

For example, a CCFL backlighting system often operates in a resonant mode, where the PWM switching frequency needs to stay within a narrow range around a resonant frequency. Outside the narrow range, the gain of the CCFL backlighting system often drops significantly, and the CCFL backlighting system then usually operates under abnormal conditions. Hence it is highly desirable to improve the techniques for oscillation systems.

Figure 7:
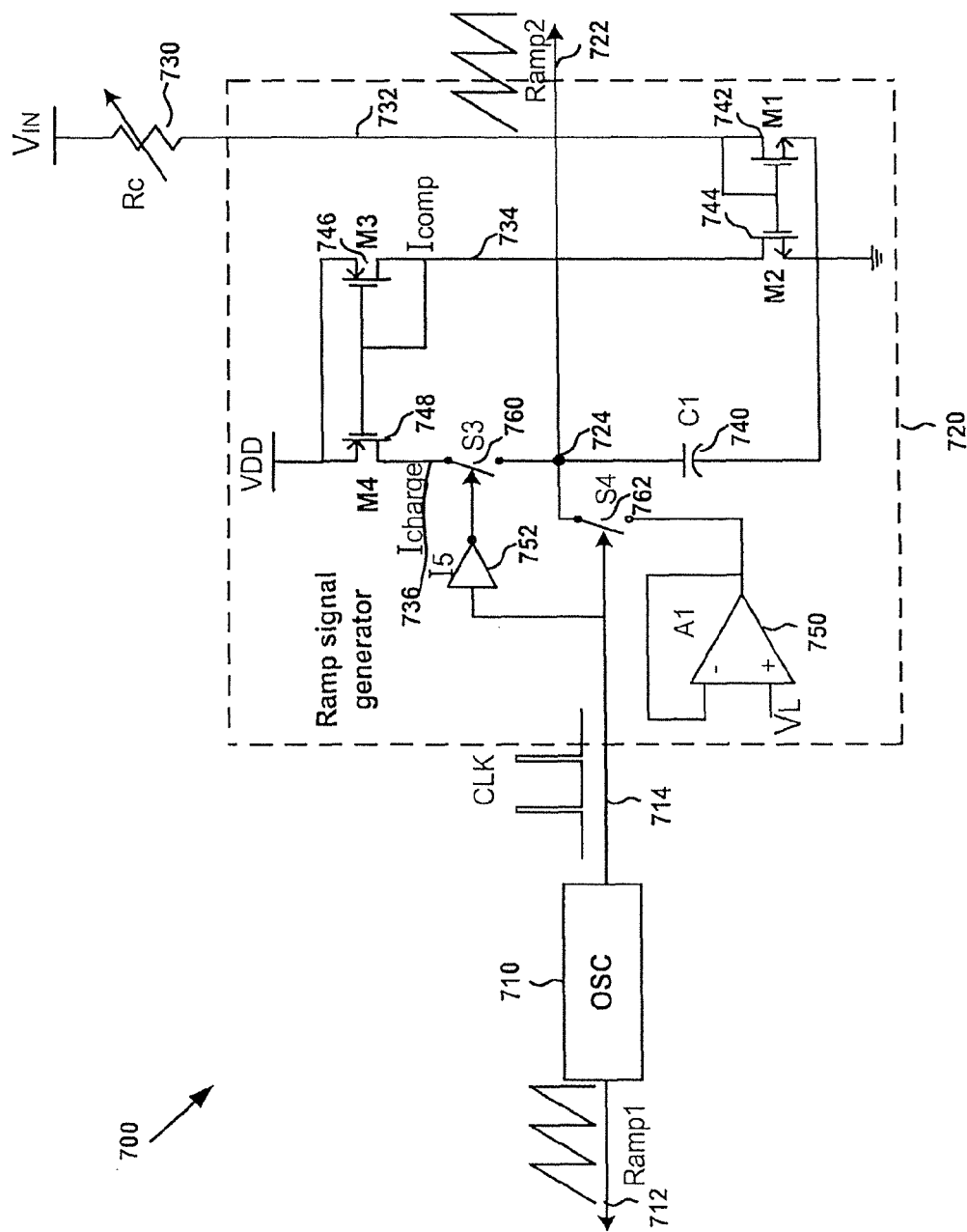
FIG. 7 is a simplified diagram showing an oscillator system for generating one or more ramp signals according to one embodiment of the present invention.

FIG. 7 is a simplified diagram showing an oscillator system for generating one or more ramp signals according to one embodiment of the present invention. This diagram is merely an example, which should not unduly limit the scope of the claims. One of ordinary skill in the art would recognize many variations, alternatives, and modifications.

As shown, the oscillator system 700 includes an oscillator 710, a ramp signal generator 720, and a resistor 730. According to an embodiment, the oscillator 710 generates a ramp signal 712 and a clock signal 714. For example, the oscillator 710 is the same as the oscillator 120. In another example, the ramp signal 712 is the same as the ramp signal 122, and the clock signal 714 is the same as the clock signal 124. The clock signal 714 is received by the ramp signal generator 720, which is coupled to the resistor 730. For example, the resistance value $R_C$ of the resistor 730 is adjustable. In another example, the resistor 730 is external to a chip where the oscillator 710 and the ramp signal generator 720 are located. In yet another example, the ramp signal generator 720 outputs a ramp signal 722.

According to one embodiment, the ramp signal generator 720 includes a capacitor 740, transistors 742, 744, 746, and 748, an operational amplifier 750, a NOT gate 752, and switches 760 and 762. For example, the gate and the source of the transistor 742 are connected. In another example, a current 732 that flows through the resistor 730 is determined by at least the input voltage $V_{IN}$ and the resistance value $R_C$. In yet another example, the transistors 742 and 744 form a current mirror, and the transistors 746 and 748 form another current mirror.

As shown in FIG. 7, the current 732 is mirrored by the transistors 742 and 744 to generate a current 734, and the current 734 is mirrored by the transistors 746 and 748 to generator a current 736. According to one embodiment, if the switch 760 is closed, the magnitude of the current 736 is $$I_{charge} = k \times \frac{V_{IN} - V_{th}}{R_C} \qquad (6)$$

Where $I_{charge}$ represents the magnitude of the current 736. Additionally, $V_{th}$ represents the threshold voltage of the transistor 742, and k represents the combined current ratio for the current mirror of the transistors 742 and 744 and the current mirror of the transistors 746 and 748.

According to one embodiment, when the clock signal 714 is at the logic high level, the switch 762 is closed and the switch 760 is open. For example, the ramp signal 722 at a node 724 is adjusted by the operational amplifier 750 to a predetermined voltage $V_L$. In another example, the predetermined voltage $V_L$ is used by the operational amplifier 750 as a reference voltage.

According to another embodiment, when the clock signal 714 is at the logic low level, the switch 762 is open and the switch 760 is closed. For example, the capacitor 740 is charged by the current 736. In another example, the voltage level of the ramp signal 722 at the node 724 increases with time until the clock signal 714 returns to the logic high level.

As shown in FIG. 7, the current 736 is determined at least in part by the input voltage $V_{IN}$ and the resistance value $R_C$ of the resistor 730 according to an embodiment. For example, the resistance value $R_C$ is adjustable and used to determine the compensation coefficient for feed forward compensation. In another example, with the same resistance value $R_C$, the current 736 increases with the input voltage $V_{IN}$. In one embodiment, when the current 736 becomes larger, the charging of the capacitor 740 becomes faster and the upward slope of the ramp signal 722 becomes larger. In another embodiment, when the current 736 becomes smaller, the charging of the capacitor 740 becomes slower and the upward slope of the ramp signal 722 becomes smaller. In yet another embodiment, the frequency of the ramp signal 722 is determined by the oscillator 710 and is independent of the input voltage $V_{IN}$.

Figure 8:
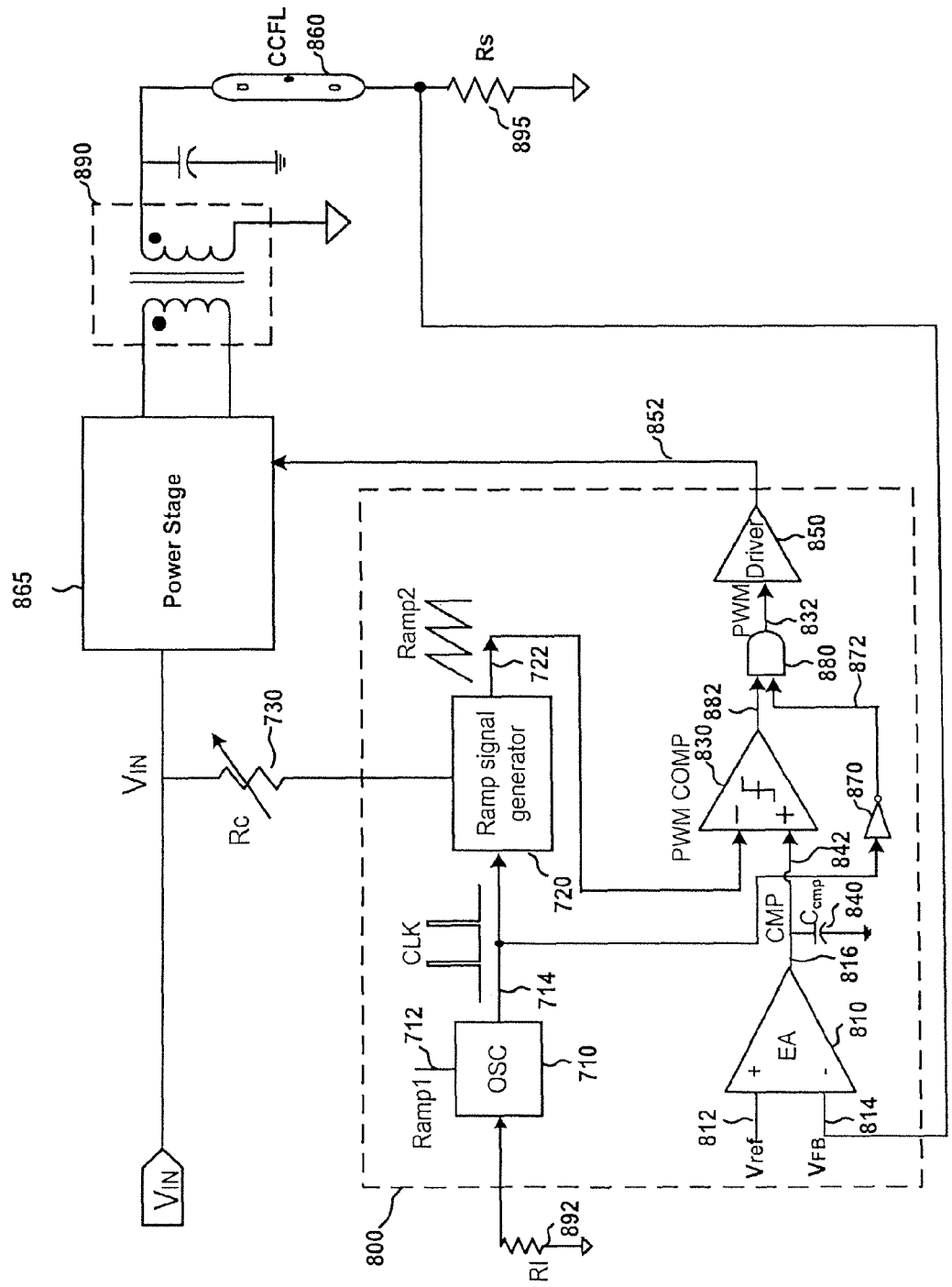
FIG. 8 is a simplified diagram showing a PWM control system that uses the oscillator system according to an embodiment of the present invention.

FIG. 8 is a simplified diagram showing a PWM control system that uses the oscillator system 700 according to an embodiment of the present invention. This diagram is merely an example, which should not unduly limit the scope of the claims. One of ordinary skill in the art would recognize many variations, alternatives, and modifications.

As shown in FIG. 8, the PWM control system 800 includes an error amplifier 810, a PWM comparator 830, a capacitor 840, a driver 850, the oscillator 710, the ramp signal generator 720, a NOT gate 870, and an AND gate 880. For example, the error amplifier 810 is the same as the error amplifier 110, the PWM comparator 830 is the same as the PWM comparator 130, the capacitor 840 is the same as the capacitor 140, the driver 850 is the same as the driver 150, and the oscillator 710 is the same as the oscillator 120. In another example, the resistor 730 is external to a chip where the PWM control system 800 is located.

In one embodiment, the oscillator 710 generates the ramp signal 712 and the clock signal 714. For example, the oscillator 710 is coupled to a resistor 892, which is used to adjust the frequency of the ramp signal 712 and the clock signal 714. In another example, the clock signal 714 is received by the ramp signal generator 720, which is coupled to the resistor 730. In yet another example, the ramp signal generator 720 outputs the ramp signal 722 to the PWM comparator 830.

In another embodiment, the error amplifier 810 receives a reference voltage $V_{ref}$ at a "+" terminal 812 and a feedback voltage $V_{FB}$ at a "−" terminal 814. For example, the feedback voltage $V_{FB}$ indicates the magnitude of the current that follows through a CCFL 860. In another example, the difference between the reference voltage $V_{ref}$ and the feedback voltage $V_{FB}$ is amplified by the error amplifier 810, whose output terminal 816 is connected to the capacitor 840.

As shown in FIG. 8, the capacitor 840 and the error amplifier 810 output a CMP signal 842 to the PWM comparator 830. For example, the PWM comparator 830 also receives the ramp signal 722 from the ramp signal generator 720. In another example, the ramp signal 722 is compared to the CMP signal 842 by the PWM comparator 830, which generates a comparison signal 882. In yet another example, the NOT gate 870 receives the clock signal 714 from the oscillator 710 and outputs the inverted signal 872. According to one embodiment, the AND gate 880 receives the inverted signal 872 and the comparison signal 882 and outputs a PWM control signal 832 to the driver 850.

In one embodiment, the PWM control signal 832 is generated in part by comparing the CMP signal 842 with the ramp signal 722. The upward slope of the ramp signal 722 is determined at least in part by the input voltage $V_{IN}$ and the resistor 730 according to one embodiment. According to another embodiment, the frequency of the PWM control signal 832 is determined by the oscillator 710 and is independent of the input voltage $V_{IN}$.

For example, the PWM control signal 832 is received by the driver 850, which outputs a PWM drive signal 852 to a power stage 865. In another example, the power is transferred from the power stage 865 to an output stage through a transformer 890. In yet another example, the current that flows through the CCFL 860 is converted into the feedback voltage $V_{FB}$ by a resistor 895.

As shown in FIG. 8, when the input voltage $V_{IN}$ changes, the upward slop of the ramp signal 722 changes and consequently the width of the PWM control signal 832 also changes according to one embodiment. For example, when the input voltage $V_{IN}$ increases, the upward slop of the ramp signal 722 increases and the width of the PWM control signal 832 decreases. Consequently, the output power of the transformer 890 remains constant according to one embodiment.

Figure 9:
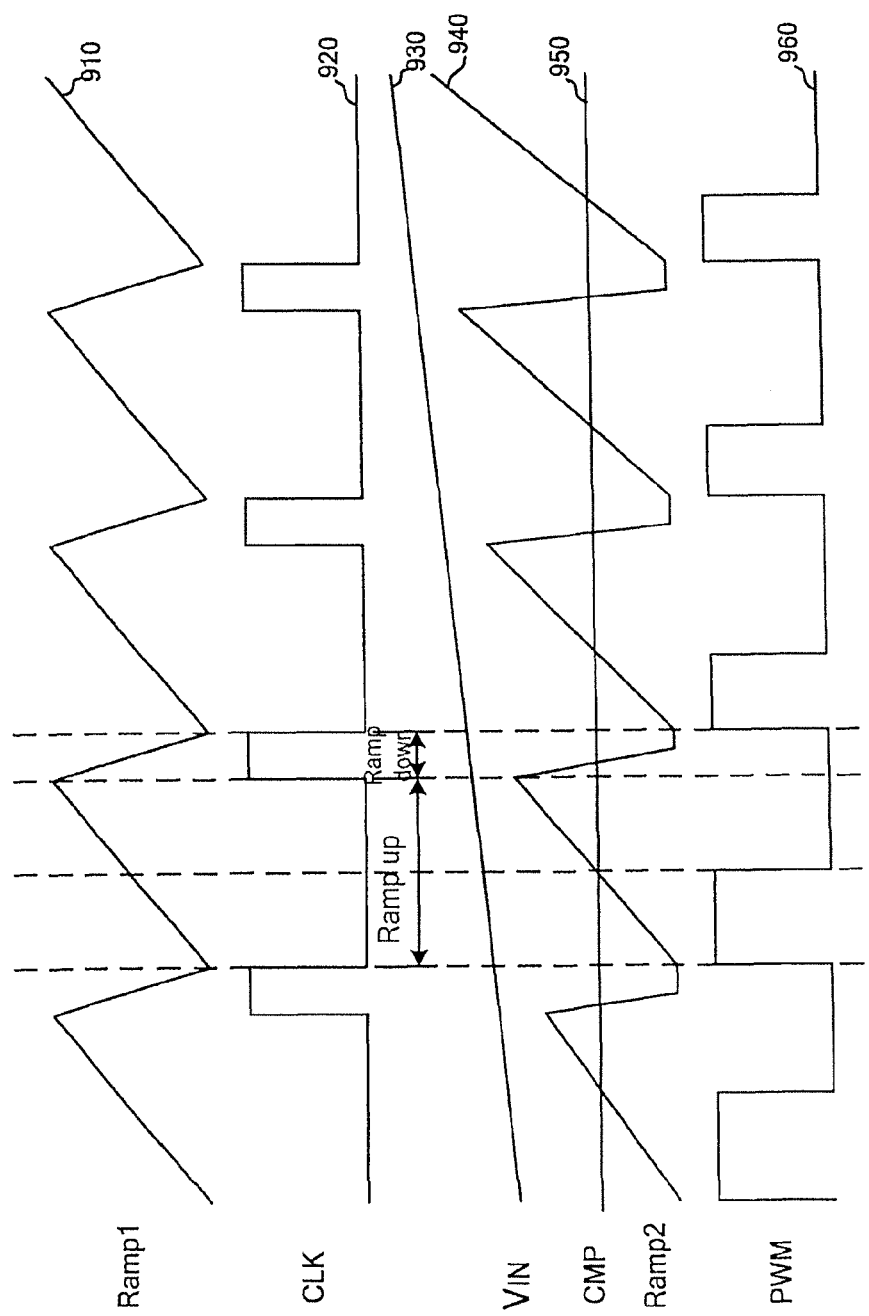
FIG. 9 is a simplified diagram showing waveforms for the PWM control system according to an embodiment of the present invention.

FIG. 9 is a simplified diagram showing waveforms for the PWM control system 800 according to an embodiment of the present invention. This diagram is merely an example, which should not unduly limit the scope of the claims. One of ordinary skill in the art would recognize many variations, alternatives, and modifications.

For example, each of waveforms 910, 920, 930, 940, 950 and 960 represents voltage as a function of time. In another example, the waveform 910 corresponds to the ramp signal 712, the waveform 920 corresponds to the clock signal 714, the waveform 930 corresponds to the input voltage $V_{IN}$, the waveform 940 corresponds to the ramp signal 722, the waveform 950 corresponds to the CMP signal 842, and the waveform 960 corresponds to the PWM control signal 832.

In one embodiment, the waveform 910 for the ramp signal 712 is shown to be a triangular waveform. In another embodiment, the ramp signal 712 and the clock signal 714 are shown to be synchronized with the same frequency. For example, the frequency of the ramp signal 712 is independent of the input voltage $V_{IN}$. In another example, the upward slope of the ramp signal 712 is independent of the input voltage $V_{IN}$.

In yet another embodiment, the clock signal 714 and the ramp signal 722 are shown to be synchronized with the same frequency. For example, the frequency of the ramp signal 722 is independent of the input voltage $V_{IN}$. In another example, the upward slope of the ramp signal 722 is feed forward compensated based on at least the input voltage $V_{IN}$.

As shown in FIG. 9, when the clock signal 920 is the logic low level, the PWM control signal 832 is at the logic high level if the voltage of the ramp signal 722 is lower than the voltage of the CMP signal 842 according to one embodiment. In another embodiment, when the clock signal 920 is the logic low level, the PWM control signal 832 is at the logic low level if the voltage of the ramp signal 722 is higher than the voltage of the CMP signal 842. In another embodiment, when the clock signal 920 is the logic high level, the PWM control signal 832 is at the logic low level regardless of whether the voltage of the ramp signal 722 is higher or lower than the voltage of the CMP signal 842.

According to one embodiment, when the input voltage $V_{IN}$ changes, the ramp signal 712 and the clock signal 714 do not change. For example, the clock signal 714 maintains the same frequency when the input voltage $V_{IN}$ changes. In another example, the ramp signal 722 has the same frequency as the clock signal 714, and the frequency of the ramp signal 722 remains constant when the input voltage $V_{IN}$ changes.

According to another embodiment, the upward slope of the ramp signal 722 increases with the increase of the input voltage $V_{IN}$. For example, the CMP signal 842 is shown to remain the same with the increase of the input voltage $V_{IN}$. In another example, the duty cycle of the PWM control signal 832 is shown to decrease with the increase of the input voltage $V_{IN}$. In yet another, the upward slope of the ramp signal 722 represents how fast the ramp signal 722 increases with time.

According to yet another embodiment, a system for generating one or more ramp signals includes an oscillator configured to generate at least a clock signal, and a ramp signal generator configured to receive at least the clock signal and generate a first ramp signal. Additionally, the ramp signal generator is coupled to a first resistor including a first terminal and a second terminal. The first resistor is configured to receive an input voltage at the first terminal and is coupled to the ramp signal generator at the second terminal. Moreover, the first resistor is associated with a first resistance value. Also, the clock signal is associated with at least a predetermined frequency. The predetermined frequency does not change if the input voltage changes from a first magnitude to a second magnitude. The first magnitude is different from the second magnitude. The first ramp signal is associated with at least the predetermined frequency and a first slope. The first slope is related to an increase of the first ramp signal, and the first slope changes if the input voltage changes from the first magnitude to the second magnitude. For example, the system is implemented according to FIG. 7, FIG. 8, and/or FIG. 9.

In another example, the first resistance value is adjustable. In yet another example, the first slope changes if the first resistance value changes and the input voltage does not change. In yet another example, the oscillator is further configured to generate a second ramp signal. The second ramp signal is associated with at least the predetermined frequency and a second slope, and the second slope is related to an increase of the second ramp signal. The second slope does not change in magnitude if the input voltage changes from the first magnitude to the second magnitude. In yet another example, the oscillator is coupled to a second resistor, and the second resistor is associated with a second resistance value. The predetermined frequency depends at least in part on the second resistance value, and the predetermined frequency is independent of the input voltage in a substantial range. In yet another example, the ramp signal generator is configured to receive a first current flowing through the first resistor. In yet another example, the ramp signal generator includes a capacitor and one or more current mirrors, and the ramp signal generator is further configured to generate a second current using the one or more current mirrors based on at least information associated with the first current if the clock signal is at a logic low level. Additionally, the ramp signal generator is further configured to charge the capacitor with the second current if the clock signal is at the logic low level. In yet another example, the second current is proportional with the first current. In yet another example, the capacitor includes a third terminal and a fourth terminal. The third terminal is biased to a predetermined voltage, and the fourth terminal is configured to output the first ramp signal.

According to yet another embodiment, a system for generating a control signal for pulse width modulation includes an oscillator configured to generate at least a clock signal, and a ramp signal generator configured to receive at least the clock signal and generate a ramp signal. The ramp signal generator is coupled to a first resistor including a first terminal and a second terminal. Additionally, the system includes an error amplifier coupled to a capacitor. The error amplifier is configured to receive a predetermined voltage and a feedback voltage and to generate an amplified signal with the capacitor. Moreover, the system includes a comparator configured to receive the amplified signal and the ramp signal and generate a comparison signal based on at least information associated with the amplified signal and the ramp signal. Also, the system includes a NOT gate configured to receive the clock signal and generate a processed signal, and an AND gate configured to receive the processed signal and the comparison signal and generate an output signal for pulse width modulation. The first resistor is configured to receive an input voltage at the first terminal and is coupled to the ramp signal generator at the second terminal, and the first resistor is associated with a first resistance value. The clock signal is associated with at least a predetermined frequency, and the predetermined frequency does not change if the input voltage changes from a first magnitude to a second magnitude. The first magnitude is different from the second magnitude. The output signal is associated with at least the predetermined frequency and a duty cycle. The duty cycle changes if the input voltage changes from the first magnitude to the second magnitude. For example, the system is implemented according to FIG. 7, FIG. 8, and/or FIG. 9.

In another example, the method further includes a driver configured to receive the output signal and outputs a drive signal. The drive signal is used to determine a current flowing through a cold-cathode fluorescent lamp. In yet another example, the feedback voltage is proportional with the current. In yet another example, the oscillator is coupled to a second resistor. The second resistor is associated with a second resistance value. The predetermined frequency depends at least in part on the second resistance value, and the predetermined frequency is independent of the input voltage in a substantial range. In yet another example, the first resistance value is adjustable.

According to yet another embodiment, a method for generating one or more ramp signals includes generating at least a clock signal by an oscillator, and receiving an input voltage by a resistor. The resistor is associated with a resistance value. Additionally, the method includes generating a first current flowing through the resistor, receiving at least the first current and the clock signal by a ramp signal generator, and generating a first ramp signal based on at least information associated with the first current and the clock signal. The clock signal is associated with at least a predetermined frequency, and the predetermined frequency does not change if the input voltage changes from a first magnitude to a second magnitude. The first magnitude is different from the second magnitude. The first ramp signal is associated with at least the predetermined frequency and a first slope, and the first slope is related to an increase of the first ramp signal. The first slope changes if the input voltage changes from the first magnitude to the second magnitude. For example, the method is implemented according to FIG. 7, FIG. 8, FIG. 9.

In another example, the first slope changes if the resistance value changes and the input voltage does not change. In yet another example, the method further comprises generating a second ramp signal by the oscillator. The second ramp signal is associated with at least the predetermined frequency and a second slope, and the second slope is related to an increase of the second ramp signal. The second slope does not change in magnitude if the input voltage changes from the first magnitude to the second magnitude. In yet another example, the process for generating a first ramp signal includes generating a second current by one or more current mirrors based on at least information associated with the first current if the clock signal is at a logic low level, charging a capacitor with the second current if the clock signal is at the logic low level, and outputting the first ramp signal by the capacitor. In yet another example, the second current is proportional with the first current.

According to yet another embodiment, a method for generating a control signal for pulse width modulation includes generating at least a clock signal by an oscillator, and receiving an input voltage by a resistor. The resistor is associated with a resistance value. Additionally, the method includes generating a first current flowing through the resistor, receiving at least the first current and the clock signal by a ramp signal generator, and generating a ramp signal based on at least information associated with the first current and the clock signal. Moreover, the method includes receiving a predetermined voltage and a feedback voltage by an error amplifier, generating an amplified signal based on at least information associated with the predetermined voltage and the feedback voltage, receiving the amplified signal and the ramp signal by a comparator, and generating a comparison signal based on at least information associated with the amplified signal and the ramp signal. Also, the method includes receiving the clock signal by a NOT gate, generating a processed signal based on at least information associated with the clock signal, receiving the processed signal and the comparison signal by an AND gate, and generating an output signal for pulse width modulation based on at least information associated with the processed signal and the comparison signal. The clock signal is associated with at least a predetermined frequency. The predetermined frequency does not change if the input voltage changes from a first magnitude to a second magnitude, and the first magnitude is different from the second magnitude. The output signal is associated with at least the predetermined frequency and a duty cycle, and the duty cycle changes if the input voltage changes from the first magnitude to the second magnitude. For example, the method is implemented according to FIG. 7, FIG. 8, and/or FIG. 9. In another example, the method further includes receiving the output signal by a driver, and outputting a drive signal to determine a second current flowing through a cold-cathode fluorescent lamp. In yet another example, the feedback voltage is proportional with the second current.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for generating one or more ramp signals, the system comprising:
    an oscillator configured to generate at least a clock signal; and
    a ramp signal generator configured to receive at least the clock signal and generate a first ramp signal, the ramp signal generator being coupled to a resistor including a first terminal and a second terminal;

wherein the resistor being configured to receive an input voltage at the first terminal and being coupled to the ramp signal generator at the second terminal, the resistor being associated with a resistance value;

wherein:
the clock signal is associated with at least a predetermined frequency;
the predetermined frequency does not change if the input voltage changes from a first magnitude to a second magnitude, the first magnitude being different from the second magnitude;
the first ramp signal is associated with at least the predetermined frequency and a first slope, the first slope being related to an increase of the first ramp signal; and
the first slope changes if the input voltage changes from the first magnitude to the second magnitude.

2. The system of claim 1 wherein the resistance value is adjustable.

3. The system of claim 2 wherein the first slope changes if the resistance value changes and the input voltage does not change.

4. The system of claim 1 wherein:
the oscillator is further configured to generate a second ramp signal;
the second ramp signal is associated with at least the predetermined frequency and a second slope, the second slope being related to an increase of the second ramp signal; and
the second slope does not change in magnitude if the input voltage changes from the first magnitude to the second magnitude.

5. The system of claim 1 wherein the ramp signal generator is configured to receive a current flowing through the resistor.

6. A method for generating one or more ramp signals, the method comprising:
generating at least a clock signal by an oscillator;
receiving an input voltage by a resistor, the resistor being associated with a resistance value;
generating a current flowing through the resistor;
receiving at least the current and the clock signal by a ramp signal generator; and
generating a first ramp signal based on at least information associated with the current and the clock signal;

wherein:
the clock signal is associated with at least a predetermined frequency;
the predetermined frequency does not change if the input voltage changes from a first magnitude to a second magnitude, the first magnitude being different from the second magnitude;
the first ramp signal is associated with at least the predetermined frequency and a first slope, the first slope being related to an increase of the first ramp signal; and
the first slope changes if the input voltage changes from the first magnitude to the second magnitude.

7. The method of claim 6 wherein the first slope changes if the resistance value changes and the input voltage does not change.

8. The method of claim 6, and further comprising:
generating a second ramp signal by the oscillator;
wherein:
the second ramp signal is associated with at least the predetermined frequency and a second slope, the second slope being related to an increase of the second ramp signal; and
the second slope does not change in magnitude if the input voltage changes from the first magnitude to the second magnitude.

\* \* \* \* \*